United States Patent
Hsu et al.

(10) Patent No.: US 9,916,978 B2
(45) Date of Patent: Mar. 13, 2018

(54) METHOD FOR FABRICATING A FIN FIELD EFFECT TRANSISTOR (FINFET)

(71) Applicant: UNITED MICROELECTRONICS CORPORATION, Hsinchu (TW)

(72) Inventors: Chih-Kai Hsu, Tainan (TW); Yu-Hsiang Hung, Tainan (TW); Wei-Chi Cheng, Kaohsiung (TW); Ssu-I Fu, Kaohsiung (TW); Jyh-Shyang Jenq, Pingtung (TW); Chao-Hung Lin, Changhua (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/170,958

(22) Filed: Jun. 2, 2016

(65) Prior Publication Data

US 2017/0352541 A1    Dec. 7, 2017

(51) Int. Cl.
| | |
|---|---|
| *H01L 21/3065* | (2006.01) |
| *H01L 21/02* | (2006.01) |
| *H01L 29/66* | (2006.01) |
| *H01L 21/308* | (2006.01) |
| *H01L 21/306* | (2006.01) |

(52) U.S. Cl.
CPC .. *H01L 21/02636* (2013.01); *H01L 21/02532* (2013.01); *H01L 21/3065* (2013.01); *H01L 21/3081* (2013.01); *H01L 21/30625* (2013.01); *H01L 29/6656* (2013.01); *H01L 29/66818* (2013.01)

(58) Field of Classification Search
CPC ............. H01L 21/3086; H01L 21/3081; H01L 21/76224
See application file for complete search history.

(56) References Cited

U.S. PATENT DOCUMENTS

| | | | |
|---|---|---|---|
| 5,518,953 A | 5/1996 | Takasu | |
| 8,324,660 B2 | 12/2012 | Lochtefeld et al. | |
| 8,546,202 B2 | 10/2013 | Tung et al. | |
| 9,123,659 B1 * | 9/2015 | Fu | H01L 21/3086 |
| 9,142,641 B1 * | 9/2015 | Lin | H01L 29/6656 |
| 2005/0263831 A1 | 12/2005 | Doris et al. | |
| 2009/0090976 A1 | 4/2009 | Kavalieros et al. | |

(Continued)

OTHER PUBLICATIONS

J. H. Nam et al. "Germanium on insulator (GOI) Structure Locally Grown on Silicon Using Hetero Epitaxial Lateral Overgrowth" p. 1-2, Oct. 7-10, 2013, IEEE S3S.

*Primary Examiner* — Kyoung Lee
*Assistant Examiner* — Christina Sylvia
(74) *Attorney, Agent, or Firm* — Ding Yu Tan

(57) ABSTRACT

The invention provides a method for fabricating a fin field effect transistor (FinFET), comprising: providing a substrate having a logic region and a large region; forming a plurality of fin structures in the logic region by removing a portion of the substrate in the logic region; forming an oxide layer on the substrate filling in-between the fin structures in the logic region; forming an first epitaxial structure in the large region by removing a portion of the substrate in the large region; exposing a portion of the fin structures and a portion of the epitaxial structure by removing a portion of the oxide layer; and forming a gate electrode on portions of the fin structures.

21 Claims, 16 Drawing Sheets

(56) References Cited

U.S. PATENT DOCUMENTS

| | | | |
|---|---|---|---|
| 2013/0115777 A1* | 5/2013 | Tung | H01L 21/3086 438/703 |
| 2014/0097518 A1* | 4/2014 | Cheng | H01L 29/0649 257/618 |
| 2015/0108616 A1 | 4/2015 | Greene et al. | |
| 2015/0214117 A1* | 7/2015 | Cheng | H01L 29/785 438/504 |
| 2016/0118263 A1* | 4/2016 | Leobandung | H01L 29/785 257/401 |

* cited by examiner

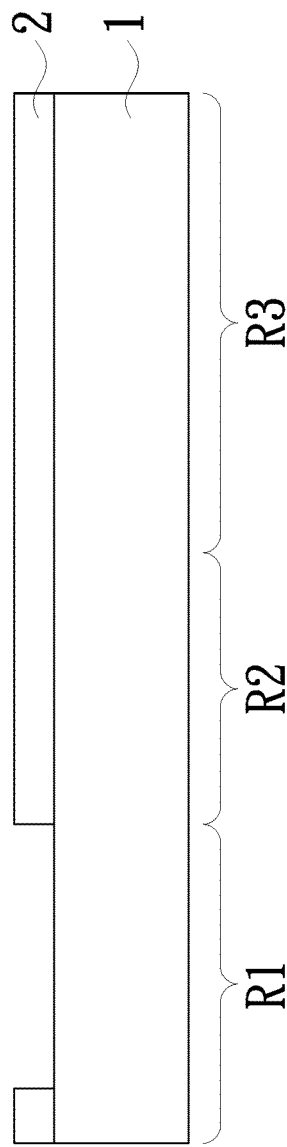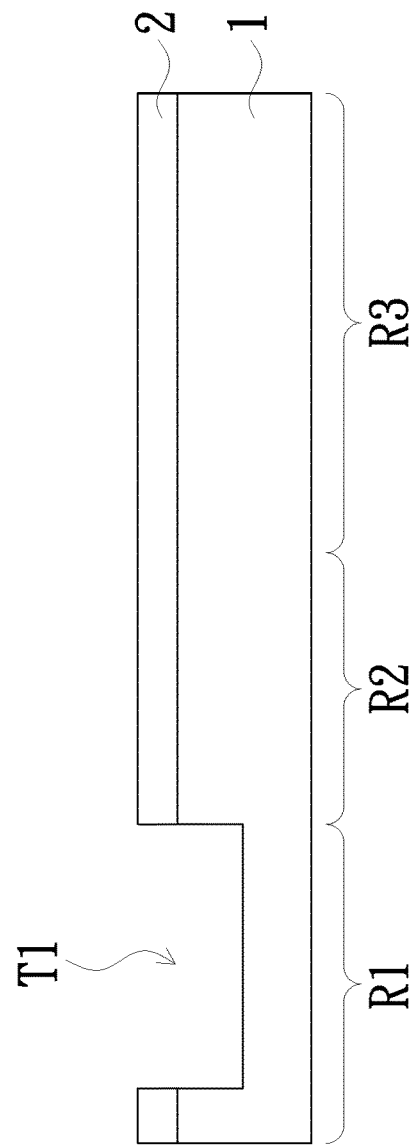
FIG. 1
FIG. 2

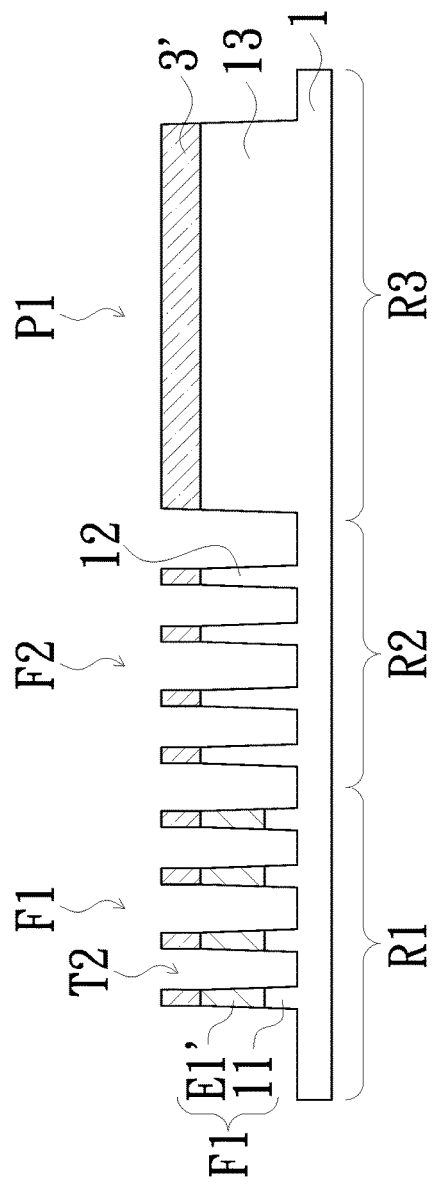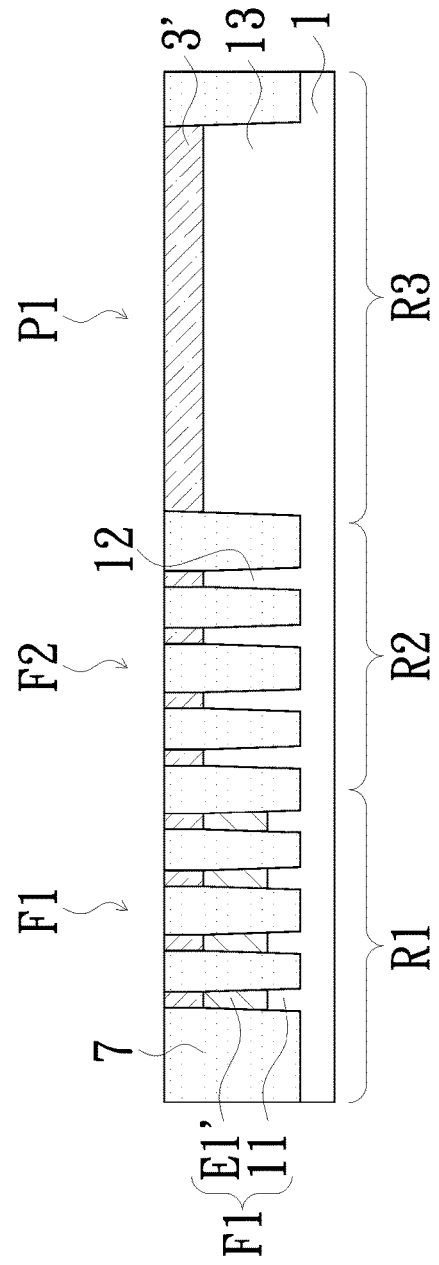

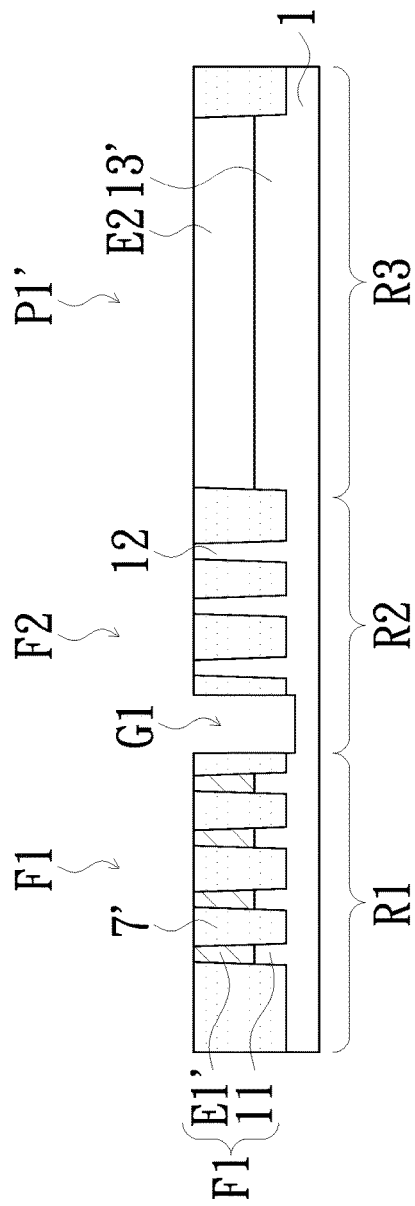
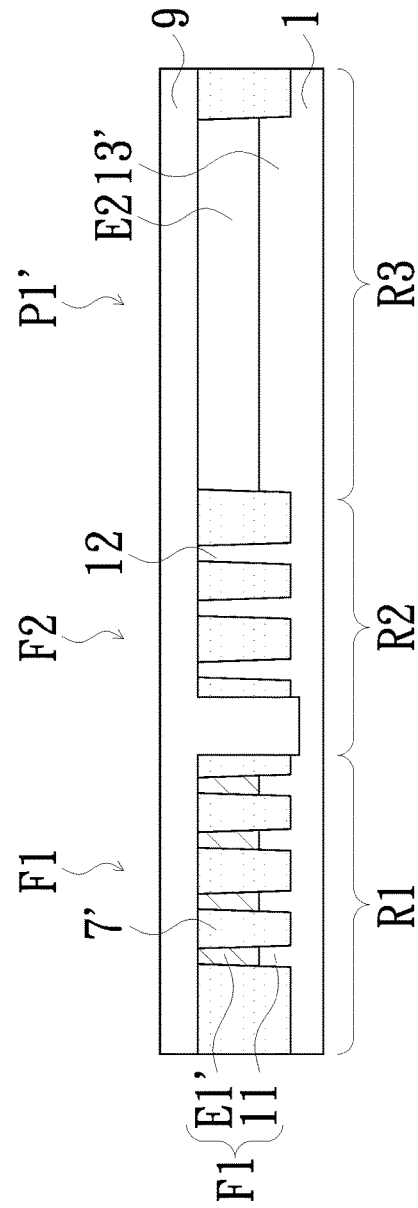

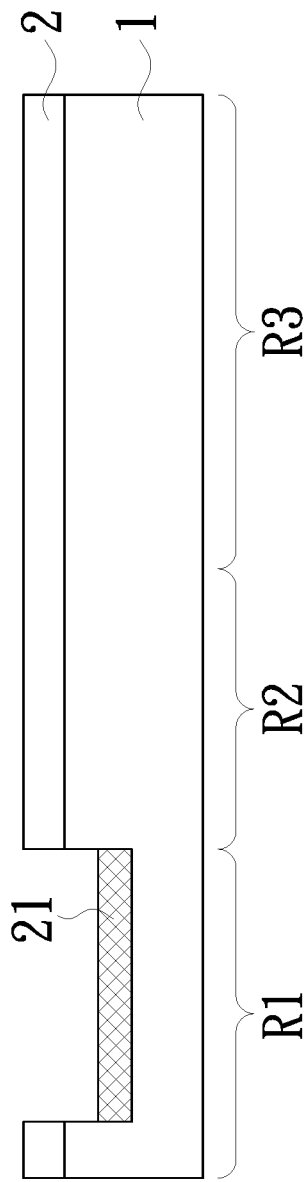
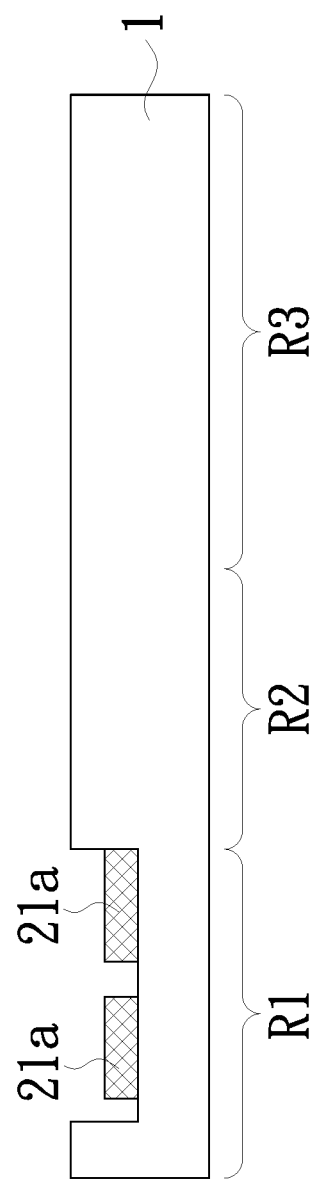

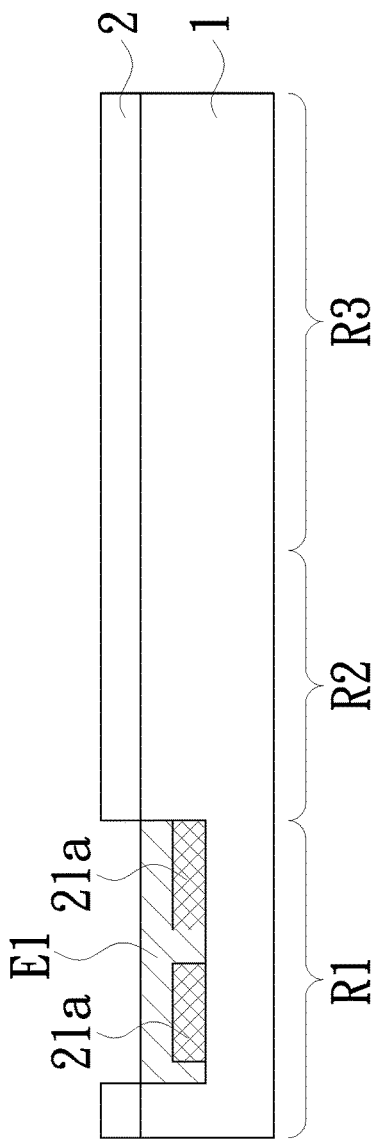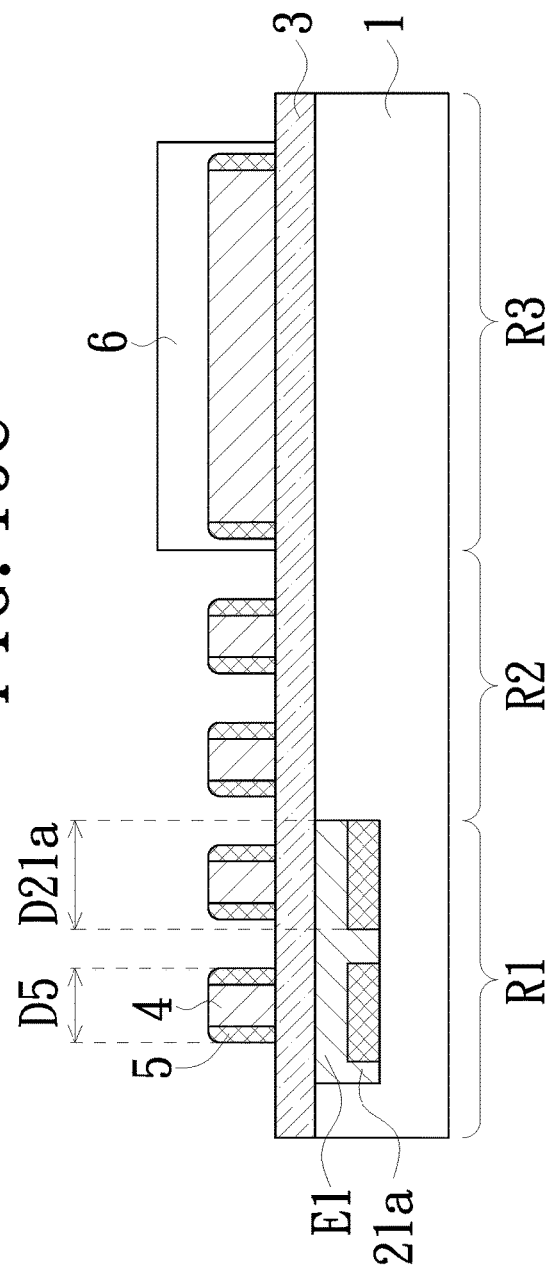

METHOD FOR FABRICATING A FIN FIELD EFFECT TRANSISTOR (FINFET)

FIELD OF THE INVENTION

The present invention relates to integrated semiconductor devices, and more particularly to an integrated semiconductor circuit that includes a double gate device, i.e., FinFET, which are fabricated on the same semiconductor substrate.

BACKGROUND OF THE INVENTION

As the semiconductor industry has progressed into nanometer technology process nodes in pursuit of higher device density, higher performance and lower costs, challenges from both fabrication and design issues have resulted in the development of three-dimensional designs, such as a fin field effect transistor (FinFET). A FinFET device is characterized by a semiconductor fin that is formed perpendicularly on a semiconductor substrate in order to provide a vertical channel within the FinFET device. This vertical channel, rather than an exclusively planar channel that is present within a planar field effect transistor device, is covered with a gate dielectric, and subsequently also with a gate electrode. The wrap-around gate structure provides a better electrical control over the channel and thus helps in reducing the leakage current and overcoming other short-channel effects.

Conventionally, thin vertical fins are formed by one of the following two methods: first, fins are formed by epitaxially growing in-between isolation structure; and second, fins are formed prior to the formation of isolation structures. However, the first method has encountered difficulties of epitaxial structure integrity as device density increase and interval between each isolation decrease making smaller space interval of epitaxial growth; and the second method has encountered problems of different heights of epitaxial structures in different sizes of areas, and thus extra CMP processes are required resulting in increases of material and process costs.

Therefore, how to improve device density and maintaining product performance and lowering manufacturing cost at the same time has become the subject of the present invention.

SUMMARY OF THE INVENTION

The present invention provides a method for fabricating a fin field effect transistor (FinFET), comprising: providing a substrate having a logic region and a large region; forming a plurality of fin structures in the logic region by removing a portion of the substrate in the logic region; forming an oxide layer on the substrate filling in-between the fin structures in the logic region; forming an first epitaxial structure in the large region by removing a portion of the substrate in the large region; exposing a portion of the fin structures and a portion of the epitaxial structure by removing a portion of the oxide layer; and forming a gate electrode on portions of the fin structures.

In one embodiment of the present invention, before the step of forming the plurality of the fin structures in the logic region, further comprising: forming a second epitaxial structure in the logic region of the substrate.

In one embodiment of the present invention, wherein the step of forming the second epitaxial structure comprises: forming a first hard mask layer on the substrate covering the logic region and the large region; forming a first recess in the logic region by removing a portion of the first hard mask and a portion of the substrate; epitaxially growing the second epitaxial structure in the first recess; and removing the hard mask layer.

In one embodiment of the present invention, wherein after forming the first recess and before the sub-step of epitaxially growing the second epitaxial structure, the step of forming the second epitaxial structure further comprises: forming a patterned dielectric layer in the first recess.

In one embodiment of the present invention, wherein some of the plurality of the fin structures comprises a top epitaxial portion, a middle dielectric portion and a bottom base portion.

In one embodiment of the present invention, wherein some of the plurality of the fin structures comprise a top epitaxial portion and a bottom base portion, and in the step of forming the plurality of the fin structures in the logic region, the plurality of the fin structures is formed by removing the portion of the substrate and a portion of the second epitaxial structure.

In one embodiment of the present invention, wherein the step of forming the plurality of the fin structures in the logic region comprises: forming a second hard mask layer on the substrate covering the logic region and the large region; forming a patterned sacrificial layer in the logic region and the large region on the substrate; forming a plurality of spacers around the patterned sacrificial layer; removing portions of the patterned sacrificial layer in the logic region on the substrate; and removing the portion of the substrate in the logic region, a portion of the substrate in the large region, and a portion of the second hard mask layer exposed by the spacers and the patterned sacrificial layer in order to form the plurality of fin structures in the logic region, a plurality of fin structures in the large region, and a patterned second hard mask layer on the fin structures in the logic region and the large region.

In one embodiment of the present invention, wherein the second hard mask layer is a multi-layer formed by at least one nitride layer and at least one oxide layer in sequence.

In one embodiment of the present invention, wherein the patterned sacrificial layer is made of amorphous silicon.

In one embodiment of the present invention, wherein the spacers are made of nitride.

In one embodiment of the present invention, wherein the oxide layer fills in-between the fin structures in the logic region and the large region and in-between remaining portions of the second hard mask layer, which are disposed on the fin structures individually.

In one embodiment of the present invention, after the step of forming the oxide layer and before the step of forming the first epitaxial structure, further comprising: removing portions of the oxide layer in-between the patterned second hard mask layer; and removing the patterned second hard mask layer.

In one embodiment of the present invention, after the step of forming a plurality of fin structures and before the step of forming the oxide layer, further comprising: performing a fin cut process to remove a portion of the fin structures.

In one embodiment of the present invention, wherein the step of forming the first epitaxial structure comprises: depositing a stop layer in the logic region and the large region covering the substrate, the oxide layer and the fin structures; forming a second recess in the large region of the substrate by removing a portion of the stop layer and a portion of the substrate in the large region; epitaxially growing the first epitaxial structure in the second recess; and removing the stop layer.

In one embodiment of the present invention, after the sub-step of epitaxially growing the first epitaxial structure and before the sub-step of removing the stop layer, further comprising: performing a planarization process to flatten the first epitaxial structure by removing a portion of the first epitaxial structure and a portion of the stop layer.

In one embodiment of the present invention, wherein a depth of the first epitaxial structure is smaller than a depth of the oxide layer.

In one embodiment of the present invention, after the step of forming the first epitaxial structure and before the step of exposing a portion of the fin structures, further comprising: performing a fin cut process to remove a portion of the fin structures and a portion of the oxide layer to form a gap; forming a gap oxide layer on the substrate filling in the gap and covering the fin structures and the first epitaxial structure; and removing a portion of the gap oxide layer above the fin structures and the first epitaxial structure.

In one embodiment of the present invention, wherein a portion of the gap oxide layer in-between the fin structures is removed in the step of exposing the portion of the fin structures.

In one embodiment of the present invention, wherein the large region and the logic region are separated by the oxide layer.

In one embodiment of the present invention, a portion of the first epitaxial structure is revealed above the oxide layer after the step of exposing the portion of the fin structures.

In one embodiment of the present invention, wherein the fin structure comprises a top epitaxial portion made of silicon germanium and a bottom portion made of silicon.

In one embodiment of the present invention, wherein the fin structure comprises elements selected from group III and group V on the periodic table.

Accordingly, the present invention provides a method for fabricating a fin field effect transistor (FinFET), which may include FinFET in both logic and large areas. The method provided by the present invention efficiently integrates the isolation first and isolation last process together. Isolation last process is performed in the logic area with smaller dimension, and isolation first process is performed in the larger area, such as ESD or peripheral region of a chip, so as to achieve better integrated results and have precise fin structures in the logic area and also reducing extra processing loading as possible.

BRIEF DESCRIPTION OF THE DRAWINGS

The present invention will become more readily apparent to those ordinarily skilled in the art after reviewing the following detailed description and accompanying drawings, in which:

FIGS. 1-4 are cross-sectional views of different steps according to an embodiment performed before the step (S2) of the present invention;

FIGS. 5-7 are cross-sectional views of different steps performed after the step shown in FIG. 4 before the step (S3) according the embodiment of the present invention;

FIGS. 8-10 are cross-sectional views of different steps performed after the step shown in FIG. 5 before the step (S4) according the embodiment of the present invention;

FIGS. 11-17 are cross-sectional views of different steps performed after the step shown in FIG. 10 before the step (S5) according the embodiment of the present invention;

FIGS. 19A-19E are cross-sectional views of different steps according to another embodiment of the present;

DETAILED DESCRIPTION OF PREFERRED EMBODIMENTS

Figure 3:
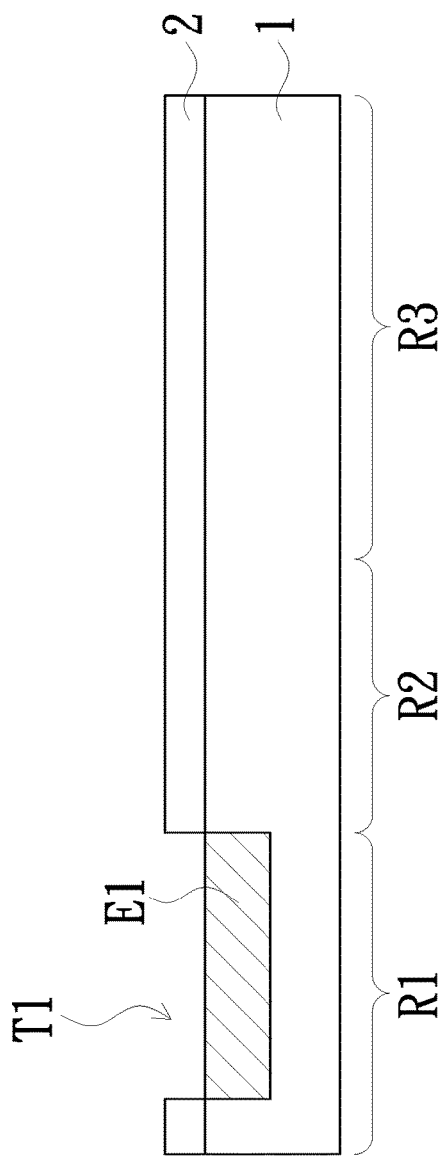

The present invention provides a method for fabricating a fin field effect transistor (FinFET), which may include FinFET in both logic and large areas. The method provided by the present invention efficiently integrates the isolation first and isolation last process together. Isolation last process is performed in the logic area with smaller dimension, and isolation first process is performed in the larger area, such as ESD (Electrostatic Discharge) or peripheral region of a chip, so as to have precise fin structures in the logic area and also reducing extra processing loading as possible. It is to be noted that the following descriptions of preferred embodiments of this invention are presented herein for purpose of illustration and description only but not intended to be exhaustive or to be limited to the precise form disclosed.

In the following illustration, the element arranged repeatedly is described in word "one", "a" or "an" for simpler explanation. However, one skilled in the art should understand the practical structure and arrangement of each element based on the following illustration and figures provided in the present application. In addition, processes for forming a P type FinFET transistor in the large region is used for illustration only in the following description but not intends to limit the present invention. The method provided by the present invention can be also applied to forming a planar transistor in the large region of a chip as well.

The present invention provides a method for fabricating a fin field effect transistor (FinFET), which comprises the following steps: (S1) providing a substrate having a logic region and a large region; (S2) forming a plurality of fin structures in the logic region by removing a portion of the substrate in the logic region; (S3) forming an oxide layer on the substrate filling in-between the fin structures in the logic region; (S4) forming a first epitaxial structure in the large region by removing a portion of the substrate in the large region; (S5) exposing a portion of the fin structures and a portion of the epitaxial structure by removing a portion of the oxide layer; and (S6) forming a first gate structure on portions of the fin structures, and a second gate structure on portions of the epitaxial structure. More detailed descriptions and other sub-steps are illustrated below with figures and embodiments. The figures showing the different steps and different embodiments of the present invention; however, they are for illustration only but not intend to limit the present invention.

As shown in FIGS. 1-4, with accordance of the step (S1) and other optional steps or sub-steps before the step (S2), a substrate 1 has a first logic region R1, a second logic region R2, and a large region R3. The first logic region R1 and the second logic region R2 are core regions of a chip and have different conductive types, and the large region R3 is a peripheral region or a region requires less density in a chip, such as ESD region. The first and second logic regions R1 and R2, for example, are PFET region and NFET region respectively, and the large region R3 is a PFET region in this embodiment. The figures are following or showing the embodiment with a PFET region R1, a NFET region R2, and a PFET region R3 for illustration of how the present invention highly integrating the process into a chip having different conductive types and also different functional regions, but it is not intended to limit the present invention. In other embodiments, the substrate 1 can have only PFET logic region or only NFET logic region alone with NFET or PFET large region. Moreover, the large region R3 can include planar MOS transistors or FinFETs. In this embodiment, a planar type of MOS transistors is formed in the large region R3.

In order to form epitaxial fin structures in the first logic region R1 and silicon fin structures in the second logic region R2, a patterned hard mask layer 2 is formed on the substrate 1 covering a portion of the first logic region R1, the entire second logic region R2 and the entire large region R3. The patterned hard mask layer 2 can be formed by firstly depositing a hard mask layer (i.e. a photosensitive SiN layer) on the substrate 1 covering the first logic region R1, the second logic region R2 and the large region R3. Then a photolithography process is performed to remove a portion of the hard mask layer in the first logic region R1 to form the patterned hard mask layer 2. Then as shown in FIG. 2, a recess T1 in the first logic region R1 is formed via an etching process by removing a portion of the substrate 1 in the first logic region R1 using the patterned hard mask layer 2 as a mask.

Figure 4:
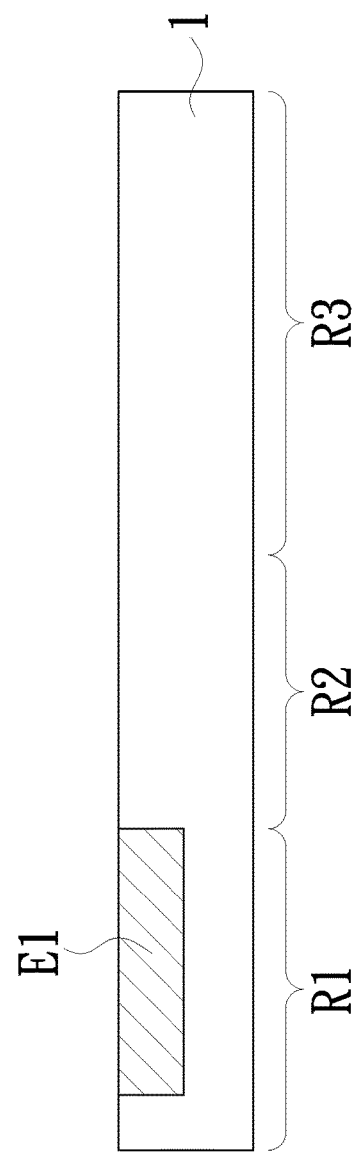

An epitaxial structure E1 (e.g. a SiGe structure) is epitaxially grown in the recess T1, and then the patterned hard mask layer 2 is removed as shown in FIGS. 3 and 4. A planarization process (e.g. a chemical mechanical planarization (CMP) process) is optionally performed in or after the step of removing the patterned hard mask layer 2 in order to have a better planar result of the epitaxial structure E1 and the substrate 1.

Figure 5:
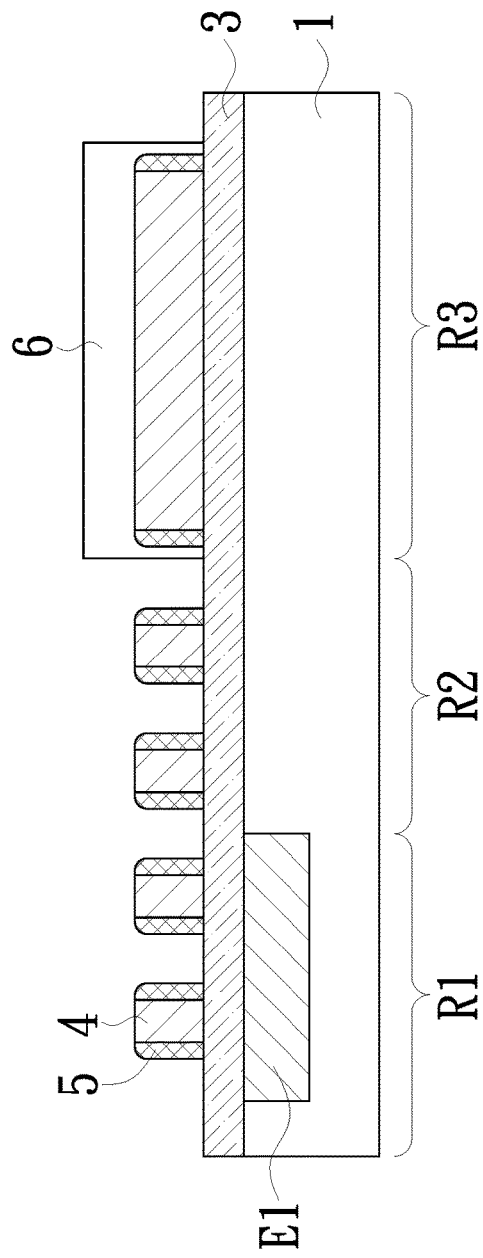
Figure 6:
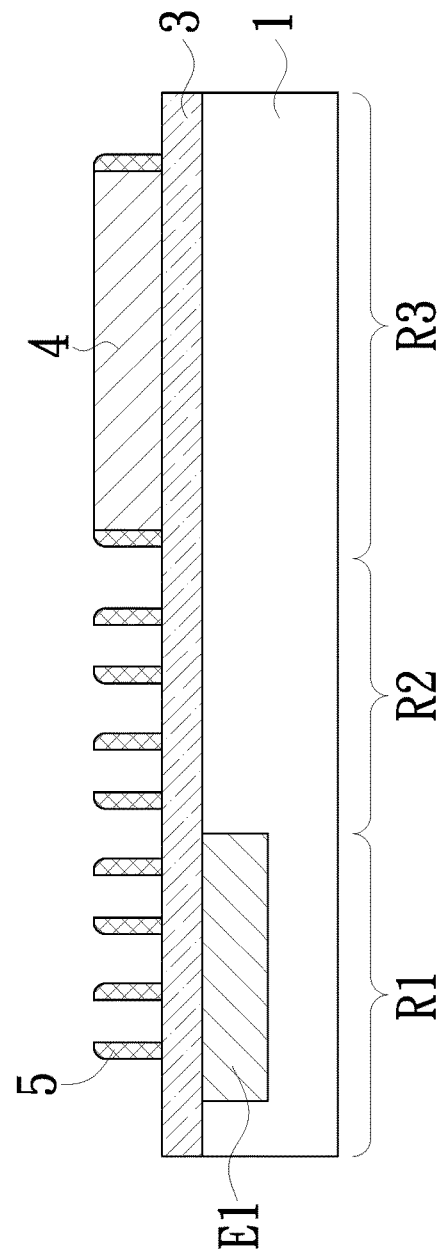

Then as shown in FIGS. 5-7 with accordance of the step (S2), in the embodiment, formation of the fin structures (e.g. epitaxial fin structures in the PFET logic region R1 and silicon fin structures having elements of group III and/or group V on periodic table in the NFET logic region R2) in the logic regions R1 and R2 is carried on by a spacer image transfer (SIT) process. As shown in FIG. 5, a hard mask layer 3 is firstly formed on the substrate 1 covering the first logic region R1, the second region R2, the large region R3. A sacrificial layer is then formed on the hard mask layer 3 and patterned to form a patterned sacrificial layer 4 on the substrate 1 in the first logic region R1, the second logic region R2, and the large region R3. A plurality of spacers 5 formed around each portion of the patterned sacrificial layer 4 on the substrate 1. In order to form fin structures in the logic regions R1 and R2 and recesses for isolations in the large region R3, a protective layer 6 is formed in the large region R3 on the substrate 1 covering all the patterned sacrificial layer 4 and the surrounded spacers 5 in the large region R3 (in the figures only one portion of the patterned sacrificial layer 4 is shown in the large region R3, however, portions of the patterned sacrificial layer 4 can be repeatedly formed on the substrate 1 in the large region R3). In the embodiment of the present invention, the hard mask layer 3 is a multi-layered material layer by forming a nitride sub-layer covering the entire substrate 1 first and then forming an oxide sub-layer covering the entire nitride sub-layer; the patterned sacrificial layer 4 is made of amorphous silicon; and the spacers 5 are made of nitride.

Afterward, portions of the patterned sacrificial layer 4 in the first logic region R1 and the second logic region R2 are removed, and then the protective layer 6 is also removed, as shown in FIG. 6. A dry etching process is then performed by using the spacers 5 in the first logic region R1, the second logic region R2 and the large region R3 and remained portions of the patterned sacrificial layer 4 in the larger region R3 together as a mask. A portion of the hard mask layer 3, a portion of the epitaxial structure E1 and a portion of the substrate 1 exposed by the mask (i.e. the spacers 5 and the portions of the patterned sacrificial layer 4 remained on the substrate 1) are removed to form a plurality of recesses T2. Then the spacers 5 and the remained portions of the patterned sacrificial layer 4 are removed. As shown in FIG. 7, a plurality of fin structures F1 are formed in the first logic region R1 having a top epitaxial portion E1' and a bottom base portion 11, a plurality of fin structures F2 are formed in the second logic region R2 having only a base portion 12, and at least a planar structure P1 is formed in the large region R3 having only a base portion 13. A patterned hard mask layer 3' is remained on each of the fin structures F1 and F2 and the planar structure P1. In the same embodiment, the portions of the patterned sacrificial layer 4 are removed by a dry etching process having a selectivity ratio between nitride and oxide. The recesses T2 may be narrow-bottomed in shape (inverted trapezoidal shape) in practical cases due to lower etching efficiency at bottom than top.

Figure 9:
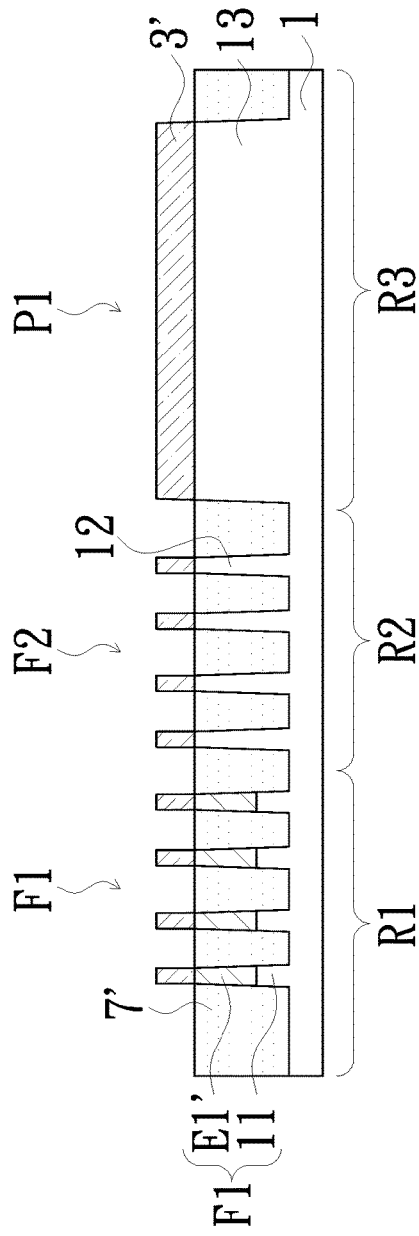
Figure 10:
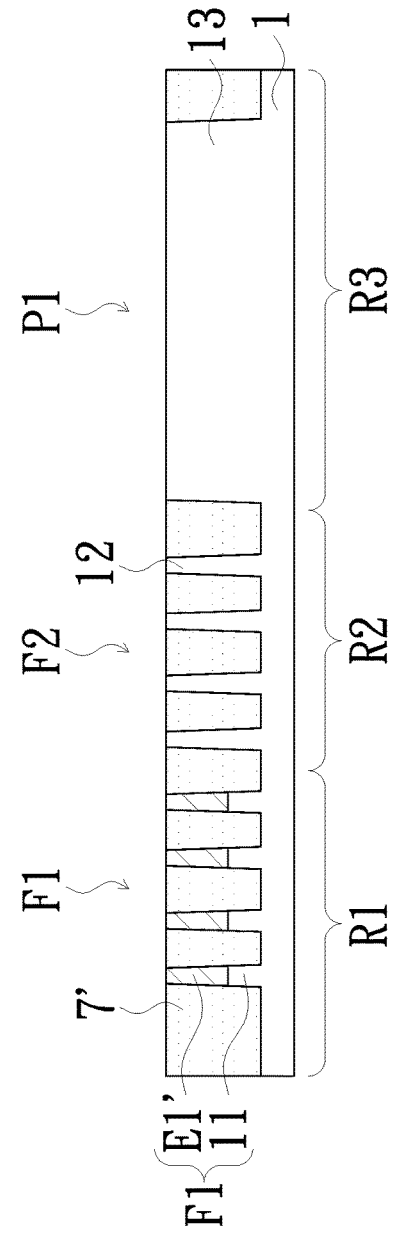

Then as shown in FIGS. 8-10 with accordance of the step (S3) of isolation formation and other optional steps or sub-steps before the step (S4), an oxide layer 7 is formed on the substrate 1 in the first and second logic regions R1 and R2 and the large region R3 filling in-between the fin structures F1 and F2 and the planar structure P1. And the patterned hard mask layer 3' is removed afterward and details are illustrated later in the specification. For a better planarized result, a CMP process is optionally performed before and/or after formation of the oxide layer 7.

In the embodiment, the oxide layer 7 is firstly filled in-between the fin structures F1 and F2 and the planar structure P1, and also in-between the patterned hard mask layer 3'; and a CMP process is performed to planarize the oxide layer 7 and the patterned hard mask layer 3' as shown in FIG. 8. Then portions of the oxide layer 7 above the substrate 1 in-between the patterned hard mask layer 3' are removed as shown in FIG. 9 to form an oxide layer 7' working as isolations between fin structures F1 and F2 and also separating the logic regions R1 and R2 from the large region R3. Sequentially, the patterned hard mask layer 3' is removed as shown in FIG. 10. Another planarization (e.g. CMP) process is optionally performed after removal of the patterned hard mask layer 3'.

Figure 11:
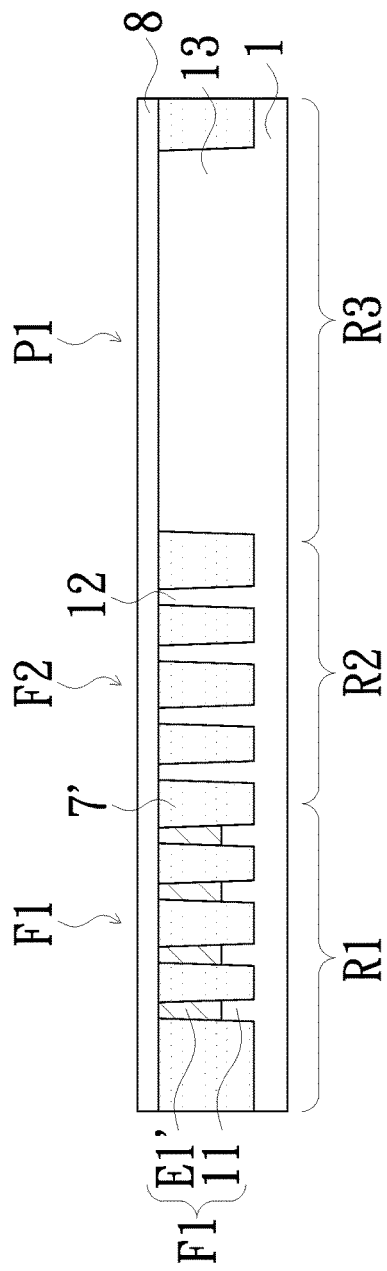
Figure 12:
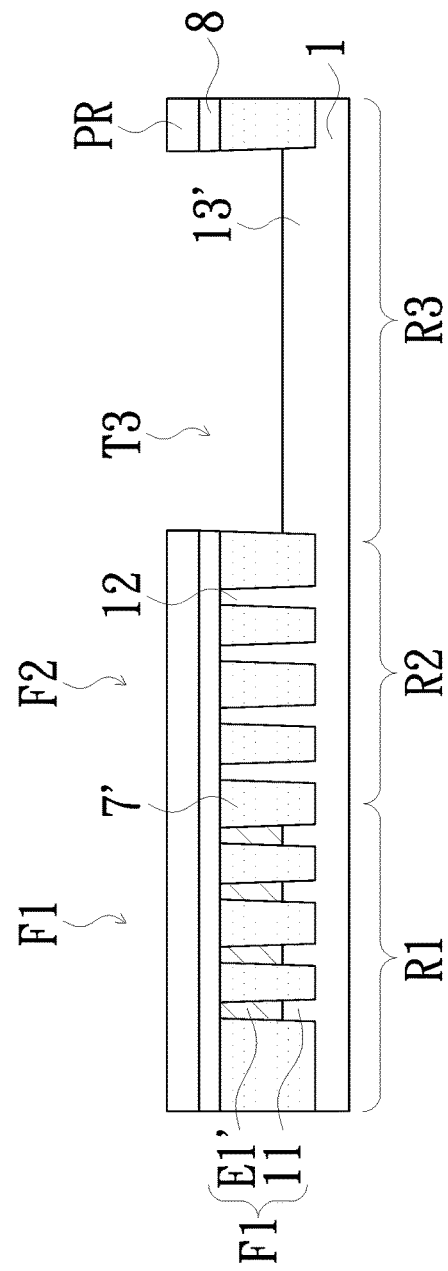
Figure 13:
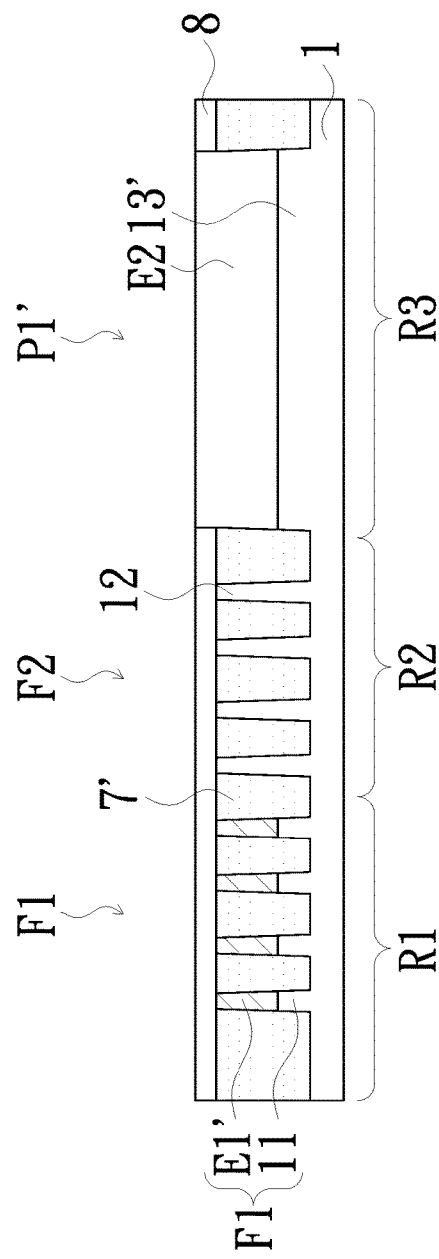
Figure 14:
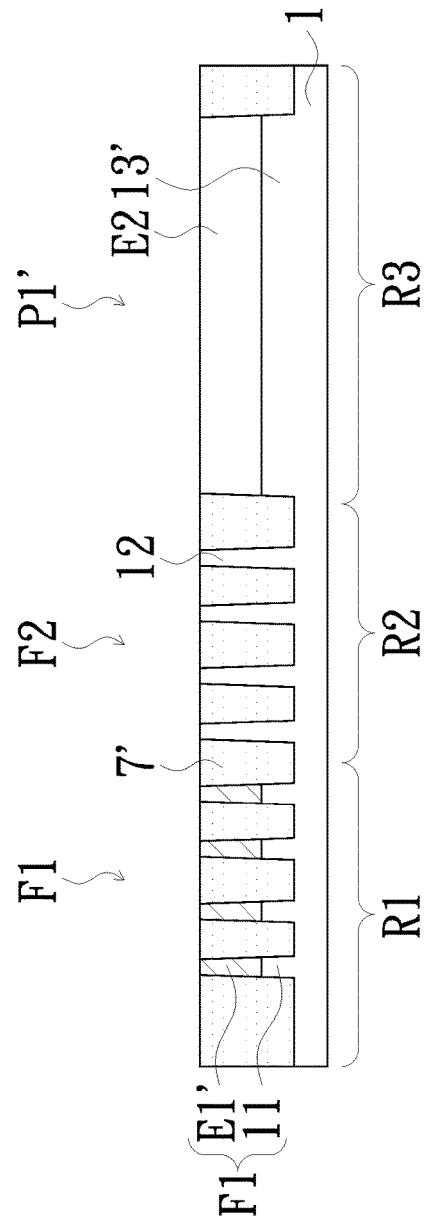

Then as shown in FIGS. 11-14 with accordance of the step (S4), an epitaxial structure E2 is formed in the large region R3. As shown in FIG. 11, a stop layer 8 is deposited on the oxide layer 7 and the entire substrate 1 covering the first logic region R1, the second logic region R2 and the large region R3. A portion of the stop layer 8 and a portion of the base portion 13 (i.e. a portion of the substrate 1 in the large region R3) are removed in order to form a recess T3 and leave a base portion 13' behind. It can be performed by a photolithography process. In the embodiment, for example, a photoresist PR is formed and then patterned to expose the portion of the stop layer 8, and then an etching process is performed to remove the portion of the stop layer 8 and the portion of the substrate 1 as shown in FIG. 12. Then the expitaxial structure E2 is epitaxially grown in the recess T3 in the large region R3, wherein a depth of the epitaxial structure E2 is smaller than a depth of the oxide layer 7'. Afterward, the photoresist PR and the stop layer 8 are removed in sequence as shown in FIGS. 13-14. Also, a CMP process is optionally performed before or after the removal of the stop layer 8 to have the planarized epitaxial structure E2. In the embodiment, a CMP process is performed after removal of the photoresist PR before removal of the stop layer 8 in order to flatten the epitaxial structure E2 by removing a portion of the epitaxial structure E2 and a portion of the stop layer 8, which provides protection to the underlying fin structures F1 and F2 and the epitaxial structure E2. The epitaxial structure E2 and the base portion 13' together to form a planar structure P1' in the large region R3.

Figure 17:
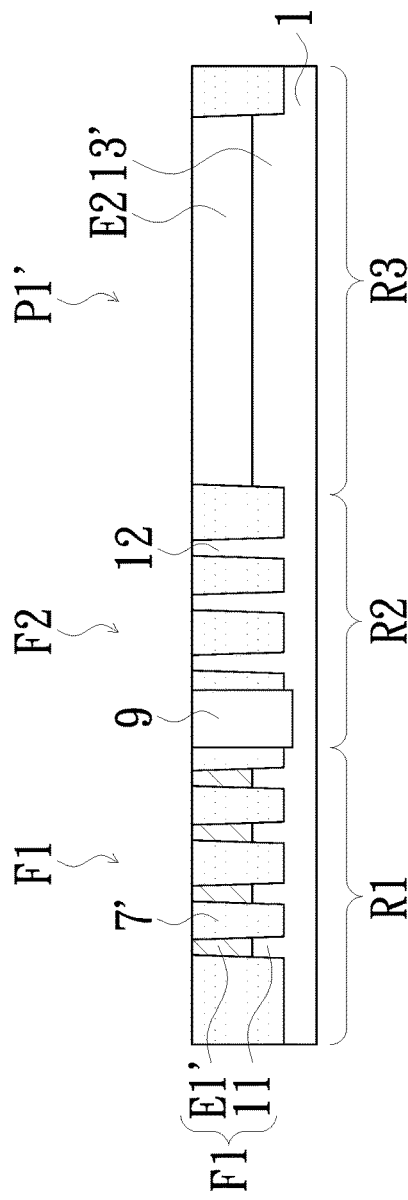
Figure 18:
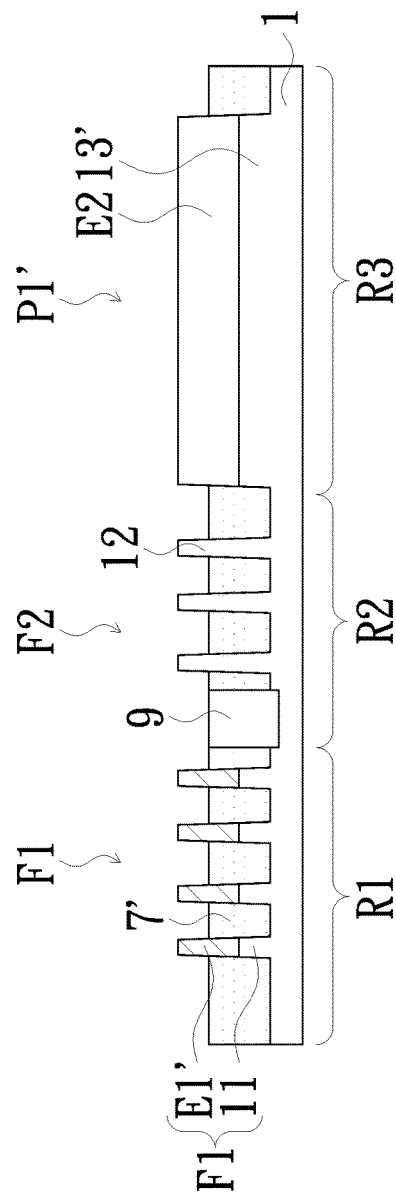
FIG. 18 is a cross-sectional view according the step (S5) performed after the step shown in FIG. 17.

Then as shown in FIGS. 15-17, in accordance with optional steps and sub-steps performed before the step (S5), a fin cut process is performed to remove unnecessary portions of the fin structures F1 and F2; and then as shown in FIG. 18, in accordance with the step (S5), a portion of the oxide layer 7' is also removed in order to reveal the fin structures F1 and F2. Because the SIT process makes the fin structures F1 and F2 in circular shapes, the fin cut process is performed to remove a portion of the fin structures F1 and F2 on two opposite sides of the fin structures F1 and F2 so as to make the fin structures F1 and F2 columnar. In the fin cut process, some other unnecessary portions of fin structures F1, F2, and a portion of the oxide layer 7' are also removed to form a gap G1. In the embodiment as shown in FIG. 15, a portion of the fin structures F2, a portion of the oxide layer 7, and even a portion of the substrate 1 are removed in the fin cut process. However, the portion of the substrate 1 does not need to be removed and removal amount of the fin structures F1/F2 and the oxide layer 7 can be varied or modified by adjusting parameters of the process in different cases. Then a gap oxide layer 9 is formed to fill in the gap G1 and also on the substrate 1 covering the first logic region R1, the second logic region R2 and the large region R3, as shown in FIG. 16. In a preferred embodiment, the gap oxide layer 9 is formed by a FCVD (flowable chemical vapor deposition) process to have a better planar result.

In order to expose or reveal a portion of the fin structures F1 and F2 and a portion of the epitaxial structure E2 of the planar structure P1, a portion of the gap oxide layer 9 and a portion of the oxide layer 7' are removed to expose the fin structures F1 and F2 and the epitaxial structure E2. As shown in FIG. 17, a portion of the gap oxide layer 9 above the fin structures F1 and F2 and the epitaxial structure E2 is removed by a CMP process to expose the top surfaces of fin structures F1 and F2, the epitaxial structure E2, and the oxide layer 7'. And then as shown in FIG. 18, a portion of the gap oxide layer 9 and a portion of the oxide layer 7 are removed to reveal the fin structures F1 and F2 and the epitaxial structure E2 by an etching process.

Afterward, gate structures are formed in the logic regions R1 and R2 and the large region R3 using conventional methods, which are omitted from the figures and description in the specification for purpose of brevity.

In another embodiment of the present invention, in order to form a GOI (Ge on Insulation) structure in the logic region, an oxide layer is formed in the logic region before performing epitaxial growth. For the purpose of easy understanding, elements with the same function use the same element numbers as illustrated in the above embodiments, and only some processes are shown in figures for illustration, other similar processes are omitted for avoiding verbosity.

Figure 19E:
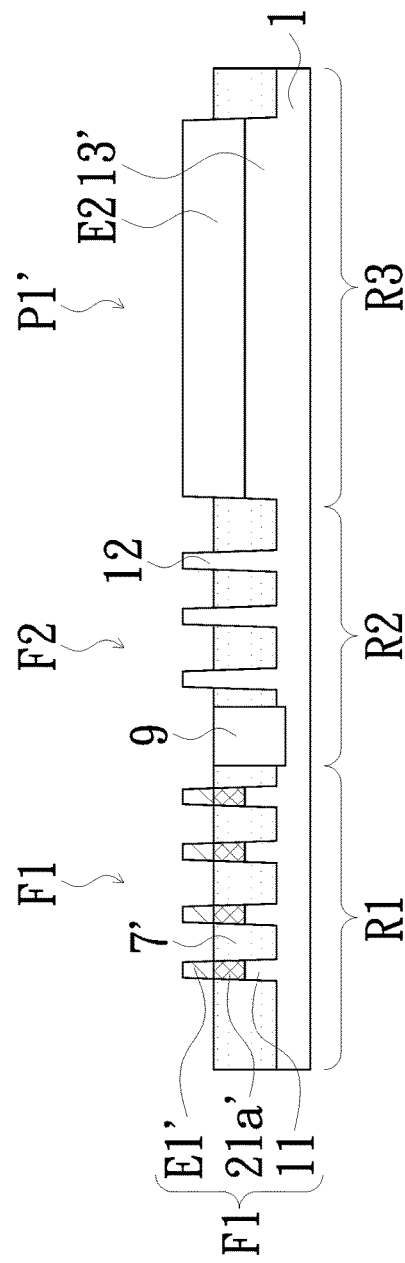

As shown in FIGS. 19A-19E according to another embodiment of the present invention, a dielectric layer 21 (oxide layer in this embodiment) is deposited at the bottom of the recess T1 first as shown in FIG. 19A. The dielectric layer 21 is then patterned in the recess T1 to form a patterned dielectric layer 21a using conventional methods as shown in FIG. 19B. The epitaxial structure E1 is formed in the recess T1 as shown in FIG. 19C, and the hard mask layer 3, the patterned sacrificial layer 4 and the surrounded spacers 5 are sequentially formed thereon as shown in FIG. 19D following the same process as illustrated above. In this embodiment, the patterned sacrificial layer 4 and the surrounded spacers 5 together have a width D5, and the patterned dielectric layer 21a has a width D21a. And it is noted that the width D5 is smaller than the width D21a, and the patterned sacrificial layer 4 and the surrounded spacers 5 are entirely positioned in a vertically corresponding area of the patterned dielectric layer 21a, so every one of the fin structures F1 as shown in FIG. 19E can have a top epitaxial portion E1', a middle dielectric portion 21a', and a bottom base portion 11. In other words, the patterned sacrificial layer 4 and the surrounded spacers 5 are totally covered by the patterned dielectric layer 21a in a direction perpendicular to an extending direction of the substrate 1.

Figure 20A:
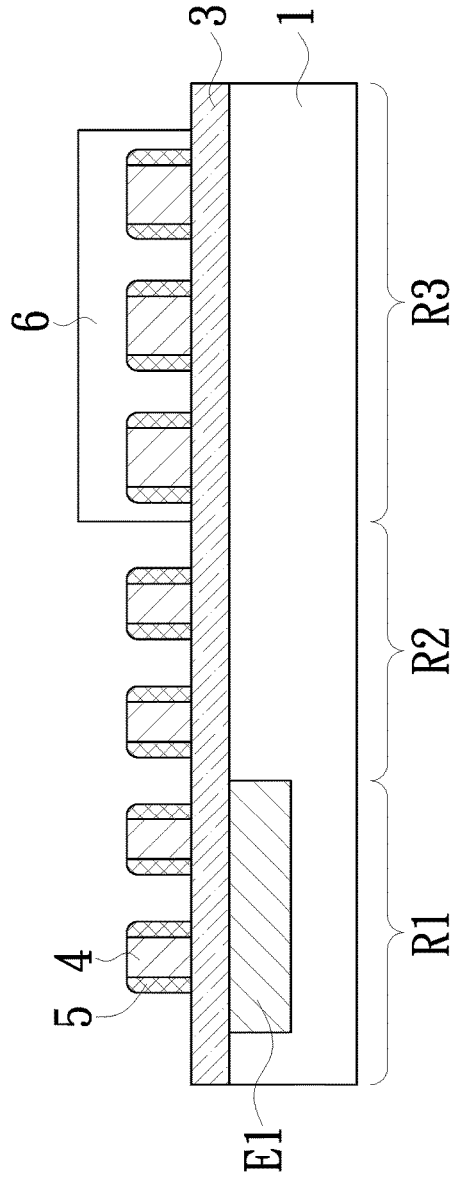
FIGS. 20A-20C are cross-sectional views of different steps according to another embodiment of the present.
Figure 20B:
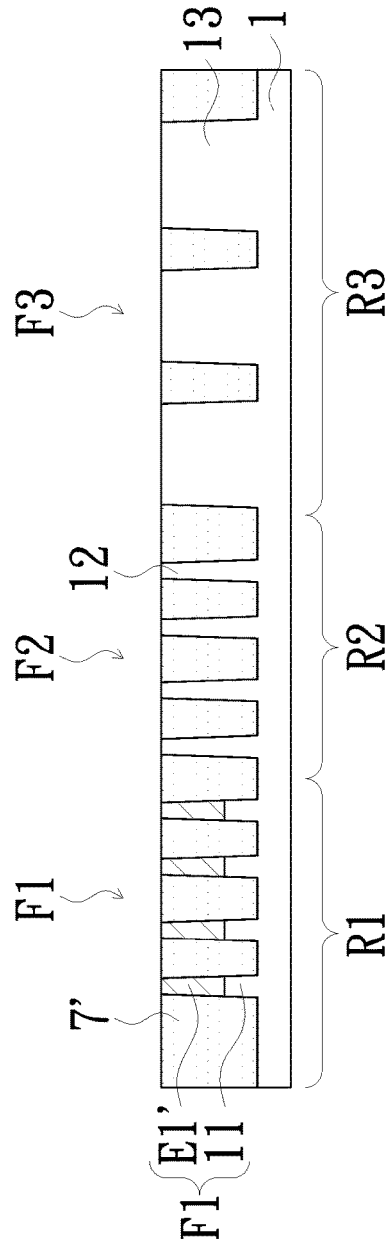
Figure 20C:
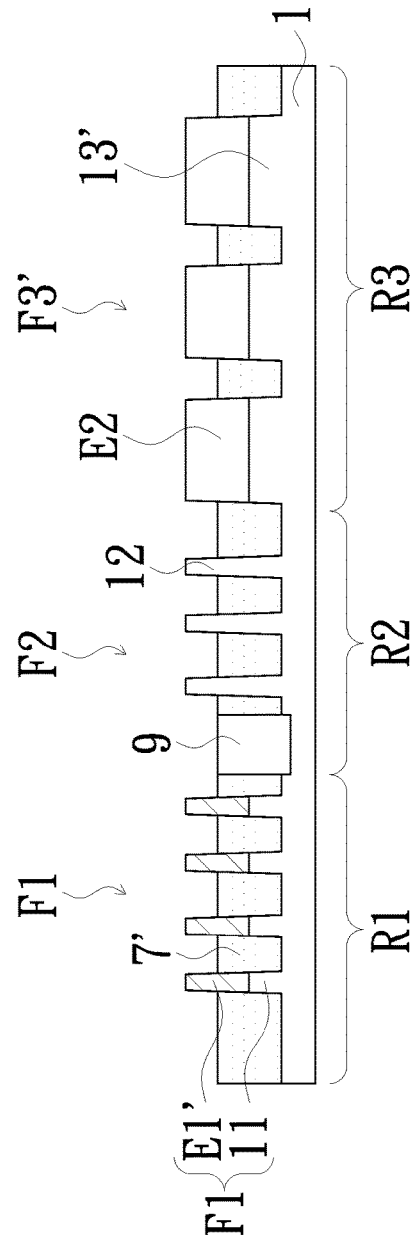

In another embodiment of the present invention, a vertical type of fin-shaped MOS transistors is formed in the large region R3. Following the same process as above illustrated, a plurality of portions of the patterned sacrificial layer 4 is formed in the large region R3, and each of the patterned sacrificial layer 4 is surrounded by a spacer 5 as shown in FIG. 20A in order to form a plurality of fin structures F3 as shown in FIG. 20B. In the step (S5), a plurality of fin structures F3' as shown in FIG. 20C are revealed by removing a portion of the oxide layer 7'.

The above embodiments are for the purpose of illustration only but not intend to limit the present invention. The processes for different types of transistors in different areas can be formed in combination, e.g. GOI FinFET in the logic area and SiGe FinFET in the large area. Thus, the present invention provides a hybrid method for fabricating a fin field effect transistor (FinFET), which may include FinFET in both logic and large areas or FinFET in logic areas and planar transistors in large areas, integrating an isolation-last and an isolation-first processes. In the above illustration, fin structures are firstly formed in the logic region by an isolation-last process in order to have good epitaxial/fin structures with a high density, and fin structures/planar structures in the large area are then formed by an isolation-first process in order to minimize process and material loading. Thus, the method provided by the present invention is a highly integrated process that suitable for different types of transistors or chips and can improve product quality and performances, and at the meanwhile, reducing material and process cost.

The above illustration shows the fin cut process performed after the step (S4), i.e. after the formation of the epitaxial structure E2. However, it is for illustration only but not intends to limit the present invention. The below description illustrates another embodiment of the present invention following the same steps (S1)~(S6) but with the fin cut process optionally performed between the steps (S2) and (S3).

Figure 21:
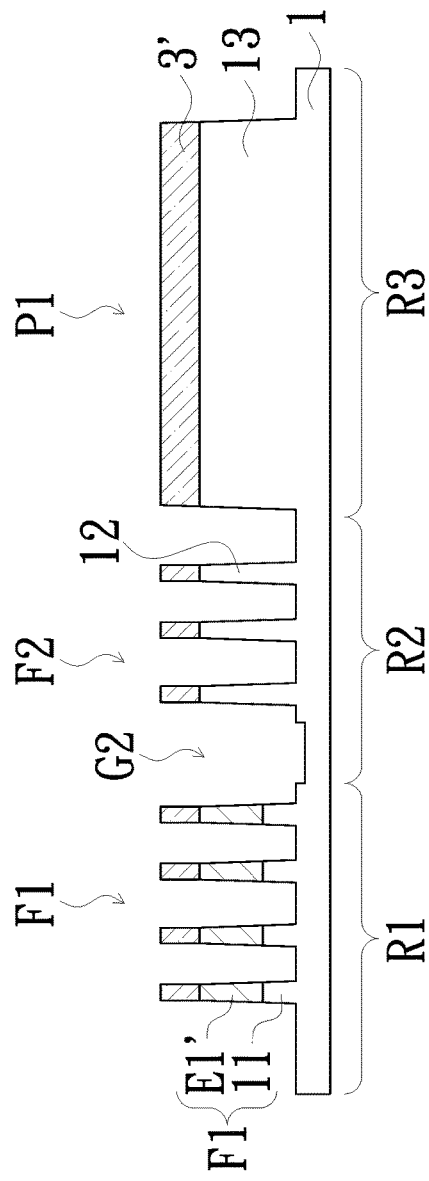
FIGS. 21-26 are cross-sectional views of different steps performed after the step shown in FIG. 7 according to another embodiment of the present invention.

The embodiment also using a planar type of MOS transistors in the large region R3 following the same process as illustrated in FIGS. 1-7, and then a fin cut process is performed after formation of the fin structures F1 and F2 as show in FIG. 21. For easier understanding, corresponding elements with the above embodiment illustrated in FIGS. 1-18 use the same element numbers or numerals in FIGS. 21-26. And description for steps with similar processes is also omitted for avoiding verbosity.

As shown in FIG. 21, the fin cut process is performed after formation of the fin structures F1 and F2 to form a gap G2.

Figure 22:
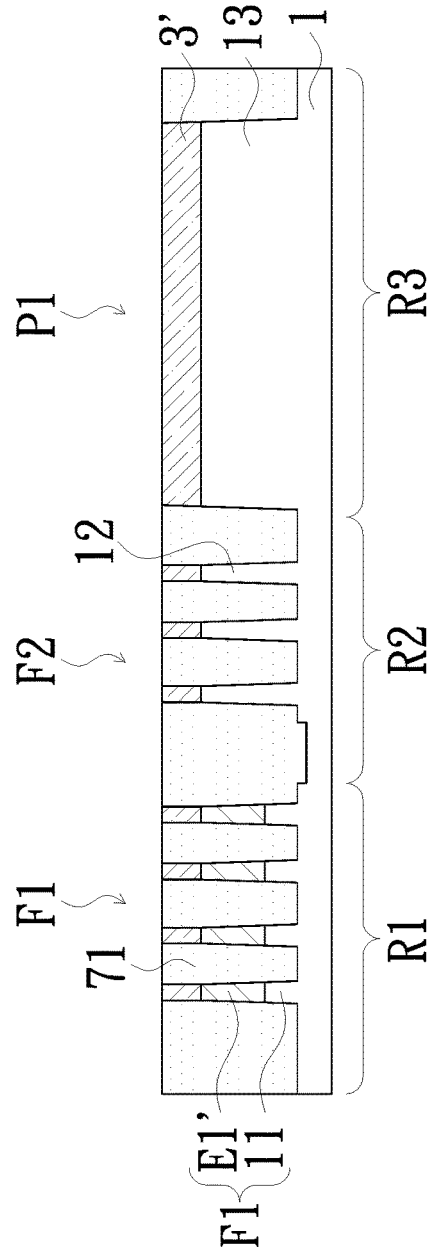
Figure 23:
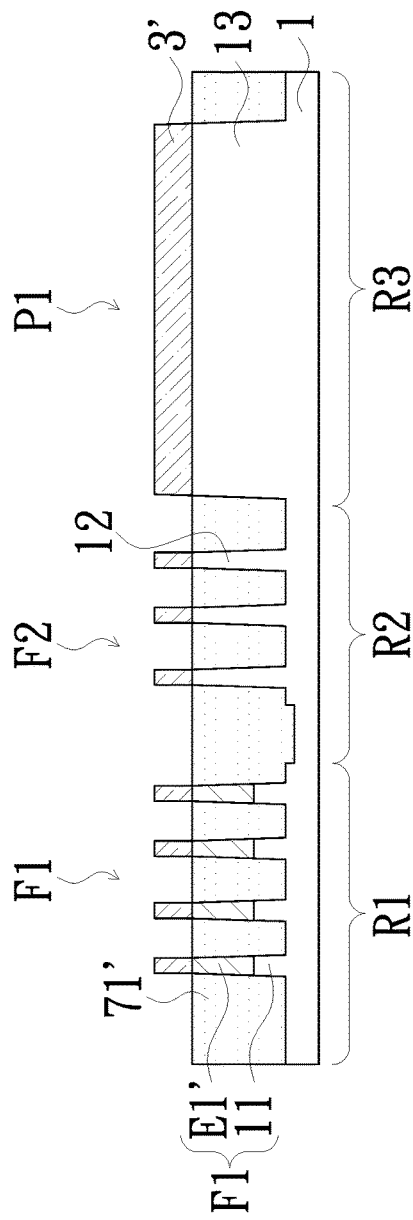
Figure 24:
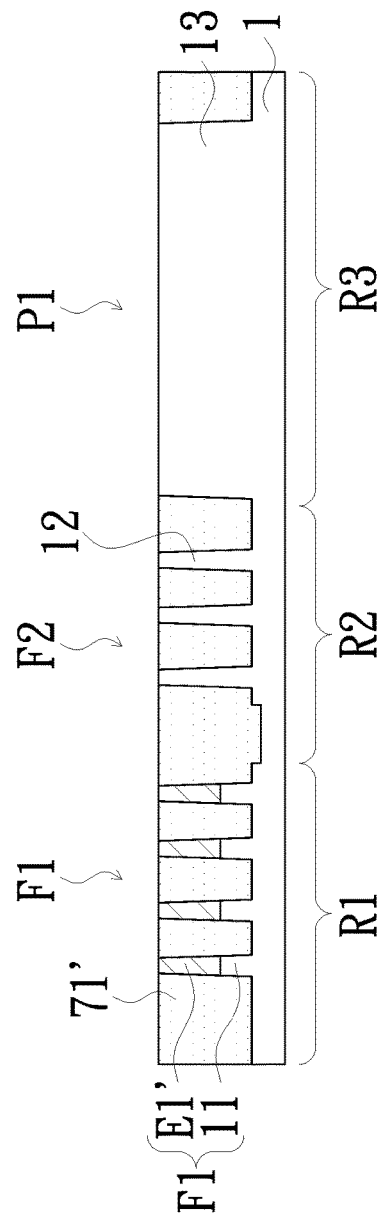

Similar to the other embodiment, a portion of the fin structures F2 and a portion of the substrate 1 are removed. And then isolation formation is performed as shown in FIGS. 22-24 by firstly forming an oxide layer 71 on the substrate 1 in the logic regions R1 and R2 and the large region R3, filling in the gap G2 and in-between the fin structures F1 and F2 and the planar structure P1, and also filling in-between the patterned hard mask layer 3'; and a CMP process is performed to planarize the oxide layer 71 and the patterned hard mask layer 3' as shown in FIG. 23. Then portions of the oxide layer 71 above the substrate 1 in-between the patterned hard mask layer 3' are removed as shown in FIG. 23 to form an oxide layer 71'. Sequentially, the patterned hard mask layer 3' is removed as shown in FIG. 24. Another planarization (e.g. CMP) process is optionally performed after removal of the patterned hard mask layer 3'.

Figure 25:
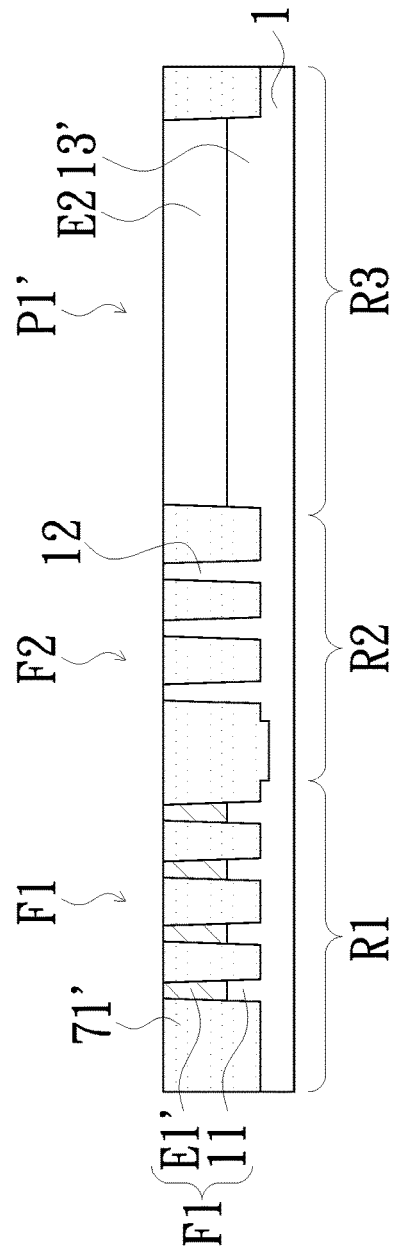
Figure 26:
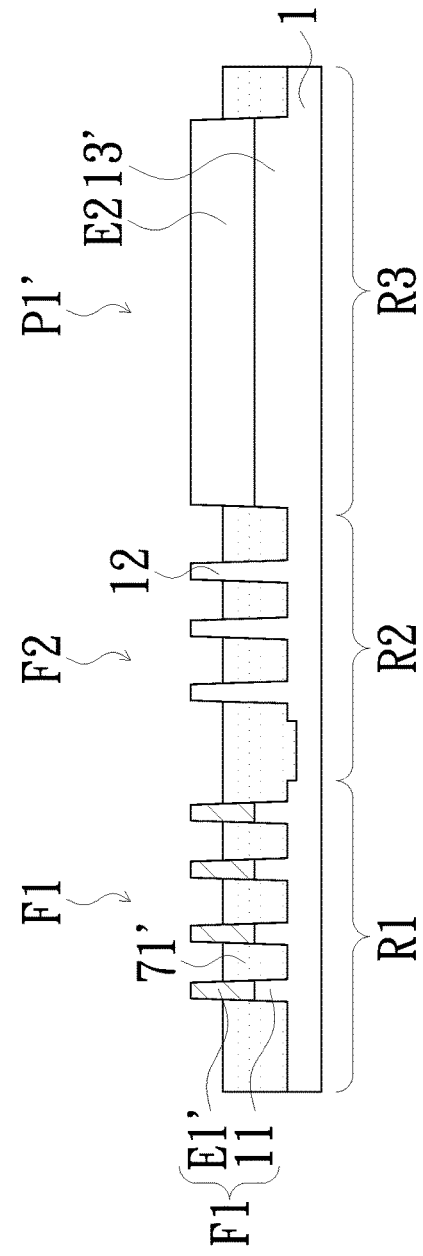

Then formation of an epitaxial structure E2 (and fin structure F3) is performed as shown in FIG. 25 following similar process as described previously. And subsequently fin structures F1 and F2 and the planar structure P1 are revealed by removal of a portion of the oxide layer 71' as shown in FIG. 26. This embodiment further reduces twice formations of oxide layers (7 and 9 in the embodiment as shown in FIGS. 1-18) into only one time (oxide layer 71 in the embodiment as shown in FIGS. 21-26) by performing the fin cut process ahead of isolation formation. Thus, formation of another gap oxide layer can be eliminated, and process and material cost can be further reduced.

After the fin structures are formed, gate structures are formed on the fin structures/planar structures in both the logic regions R1 and R2 and the large region R3. For instance, a gate dielectric layer is formed thereon covering the fin structures, and then a gate electrode is formed across on the fin structures with an extending direction perpendicular to an extending direction of the fin structures. The above embodiments have FinFET/planar transistors in the large region R3 for illustration only, and implantation processes can be optionally performed in the logic and large regions to form source/drain regions. Since the implantation process can follow the conventional methods, it is omitted from the above illustration. Moreover, dimension of the epitaxial structure E2 can be adjusted for forming a FinFET or a planar FET in the large region R3 in the present invention to match desired requirements and better integrating result.

Therefore, the present invention provides a method for fabricating a fin field effect transistor (FinFET), which may include FinFET in both logic and large regions. The method provided by the present invention efficiently integrates the isolation first and isolation last process together. Isolation last process is performed in the logic region(s) with smaller dimension, and isolation first process is performed in the larger region, such as ESD or peripheral region of a chip, so as to have precise fin structures in the logic region(s) and also reducing extra processing loading as possible.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a fin field effect transistor (FinFET), comprising:

providing a substrate having a logic region and a large region;

forming a plurality of fin structures in the logic region by removing a portion of the substrate in the logic region;

forming an oxide layer on the substrate filling in-between the fin structures in the logic region;

forming a first epitaxial structure in the large region by removing a portion of the substrate in the large region;

exposing a portion of the fin structures and a portion of the epitaxial structure by removing a portion of the oxide layer; and forming a first gate structure on portions of the fin structures, and a second gate structure on portions of the epitaxial structure, wherein a portion of the first epitaxial structure is revealed above the oxide layer after the step of exposing the portion of the fin structures.

2. The method for fabricating a fin field effect transistor (FinFET) according to claim 1, before the step of forming the plurality of the fin structures in the logic region, further comprising:

forming a second epitaxial structure in the logic region of the substrate.

3. The method for fabricating a fin field effect transistor (FinFET) according to claim 2, wherein the step of forming the second epitaxial structure comprises:

forming a first hard mask layer on the substrate covering the logic region and the large region;

forming a first recess in the logic region by removing a portion of the first hard mask and a portion of the substrate;

epitaxially growing the second epitaxial structure in the first recess; and removing the hard mask layer.

4. The method for fabricating a fin field effect transistor (FinFET) according to claim 3, wherein after forming the first recess and before epitaxially growing the second epitaxial structure, the step of forming the second epitaxial structure further comprises:

forming a patterned dielectric layer in the first recess.

5. The method for fabricating a fin field effect transistor (FinFET) according to claim 4, wherein some of the plurality of the fin structures comprise a top epitaxial portion, a middle dielectric portion and a bottom base portion.

6. The method for fabricating a fin field effect transistor (FinFET) according to claim 2, wherein some of the plurality of the fin structures comprise a top epitaxial portion and a bottom base portion, and in the step of forming the plurality of the fin structures in the logic region, the plurality of the fin structures is formed by removing the portion of the substrate and a portion of the second epitaxial structure.

7. The method for fabricating a fin field effect transistor (FinFET) according to claim 1, wherein the step of forming the plurality of the fin structures in the logic region comprises:

forming a second hard mask layer on the substrate covering the logic region and the large region;

forming a patterned sacrificial layer in the logic region and the large region on the substrate;

forming a plurality of spacers around the patterned sacrificial layer;

removing portions of the patterned sacrificial layer in the logic region on the substrate; and removing the portion of the substrate in the logic region, a portion of the substrate in the large region, and a portion of the second hard mask layer exposed by the spacers and the patterned sacrificial layer in order to form the plurality of fin structures in the logic region, a plurality of fin structures in the large region, and a patterned second hard mask layer on the fin structures in the logic region and the large region.

8. The method for fabricating a fin field effect transistor (FinFET) according to claim 7, wherein the second hard mask layer is a multi-layer formed by at least one nitride layer and at least one oxide layer in sequence.

9. The method for fabricating a fin field effect transistor (FinFET) according to claim 7, wherein the patterned sacrificial layer is made of amorphous silicon.

10. The method for fabricating a fin field effect transistor (FinFET) according to claim 7, wherein the spacers are made of nitride.

11. The method for fabricating a fin field effect transistor (FinFET) according to claim 7, wherein the oxide layer fills in-between the fin structures in the logic region and the large region and in-between remaining portions of the second hard mask layer, which are disposed on the fin structures individually.

12. The method for fabricating a fin field effect transistor (FinFET) according to claim 7, after the step of forming the oxide layer and before the step of forming the first epitaxial structure, further comprising:
  removing portions of the oxide layer in-between the patterned second hard mask layer; and
  removing the patterned second hard mask layer.

13. The method for fabricating a fin field effect transistor (FinFET) according to claim 1, after the step of forming a plurality of fin structures and before the step of forming the oxide layer, further comprising:
  performing a fin cut process to remove a portion of the fin structures.

14. The method for fabricating a fin field effect transistor (FinFET) according to claim 1, wherein the step of forming the first epitaxial structure comprises:
  depositing a stop layer in the logic region and the large region covering the substrate, the oxide layer and the fin structures;
  forming a second recess in the large region of the substrate by removing a portion of the stop layer and a portion of the substrate in the large region;
  epitaxially growing the first epitaxial structure in the second recess; and
  removing the stop layer.

15. The method for fabricating a fin field effect transistor (FinFET) according to claim 14, after the sub-step of epitaxially growing the first epitaxial structure and before the sub-step of removing the stop layer, further comprising:
  performing a planarization process to flatten the first epitaxial structure by removing a portion of the first epitaxial structure and a portion of the stop layer.

16. The method for fabricating a fin field effect transistor (FinFET) according to claim 14, wherein a depth of the first epitaxial structure is smaller than a depth of the oxide layer.

17. The method for fabricating a fin field effect transistor (FinFET) according to claim 1, after the step of forming the first epitaxial structure and before the step of exposing a portion of the fin structures, further comprising:
  performing a fin cut process to remove a portion of the fin structures and a portion of the oxide layer to form a gap;
  forming a gap oxide layer on the substrate filling in the gap and covering the fin structures and the first epitaxial structure; and
  removing a portion of the gap oxide layer above the fin structures and the first epitaxial structure.

18. The method for fabricating a fin field effect transistor (FinFET) according to claim 17, wherein a portion of the gap oxide layer in-between the fin structures is removed in the step of exposing the portion of the fin structures.

19. The method for fabricating a fin field effect transistor (FinFET) according to claim 1, wherein the large region and the logic region are separated by the oxide layer.

20. The method for fabricating a fin field effect transistor (FinFET) according to claim 1, wherein the fin structure comprises a top epitaxial portion made of silicon germanium and a bottom portion made of silicon.

21. The method for fabricating a fin field effect transistor (FinFET) according to claim 1, wherein the fin structure comprises elements selected from group III and group V on the periodic table.

* * * * *